United States Patent
Yamashita et al.

(10) Patent No.: US 6,982,555 B2
(45) Date of Patent: Jan. 3, 2006

(54) SEMICONDUCTOR DEVICE

(75) Inventors: Kyoji Yamashita, Kyoto (JP); Tatsuya Kunikiyo, Tokyo (JP); Tetsuya Watanabe, Tokyo (JP); Toshiki Kanamoto, Tokyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/777,068

(22) Filed: Feb. 13, 2004

(65) Prior Publication Data

US 2005/0007120 A1    Jan. 13, 2005

(30) Foreign Application Priority Data

Jul. 8, 2003    (JP)    .............. 2003-271883

(51) Int. Cl.
G01R 31/08    (2006.01)
G01R 31/28    (2006.01)

(52) U.S. Cl. ............. 324/519; 324/522; 324/765

(58) Field of Classification Search ............ 324/519, 324/522, 765, 158.1, 678, 769
See application file for complete search history.

(56) References Cited

U.S. PATENT DOCUMENTS

| | | | | |
|---|---|---|---|---|
| 5,677,634 A | * | 10/1997 | Cooke et al. | ............ 324/548 |
| 6,300,765 B1 | * | 10/2001 | Chen | ............ 324/519 |
| 6,624,651 B1 | * | 9/2003 | Fried et al. | ............ 324/765 |
| 6,731,129 B1 | * | 5/2004 | Belluomini et al. | ......... 324/765 |
| 6,838,869 B1 | * | 1/2005 | Rogers et al. | ............ 324/158.1 |

* cited by examiner

Primary Examiner—Anjan Deb
(74) Attorney, Agent, or Firm—McDermott Will & Emery LLP (57) ABSTRACT

PMISFETs and NMISFETs are placed in a capacitance measuring circuit. Each of interconnects is connected via the corresponding PMISFET through a charging voltage supply part to a power supply pad and via the corresponding NMISFET through a current sampling part to a current-monitoring pad. A current I can be measured by bringing a probe of an ammeter into contact with the current-monitoring pad.

12 Claims, 8 Drawing Sheets

SEMICONDUCTOR DEVICE

BACKGROUND OF THE INVENTION

The present invention relates to a method for separately measuring capacitive components in a semiconductor device and a Test Element Group (TEG) pattern having its function.

In the design and development of high-performance LSIs, it is significant to sample (measure) the characteristics of semiconductor elements placed in an LSI with high accuracy, and a technique for sampling (measuring) the same and the optimal design of a TEG are required.

In recent years, as semiconductor elements become finer, the influences of noises caused by crosstalk and the degradation of delay characteristics due to a Miller capacitance have become more obvious. Therefore, it has been required to sample capacitive components of individual conductor members, such as interconnects and semiconductor layers, of the characteristics of the semiconductor device with high accuracy.

A technique for sampling parasitic capacitances as disclosed in Patent Document 1 (U.S. Pat. No. 6,300,765 B1) has been conventionally known. The objective of this technique is to separately measure interconnect-to-interconnect capacitances C12 and C13.

Figure 7:
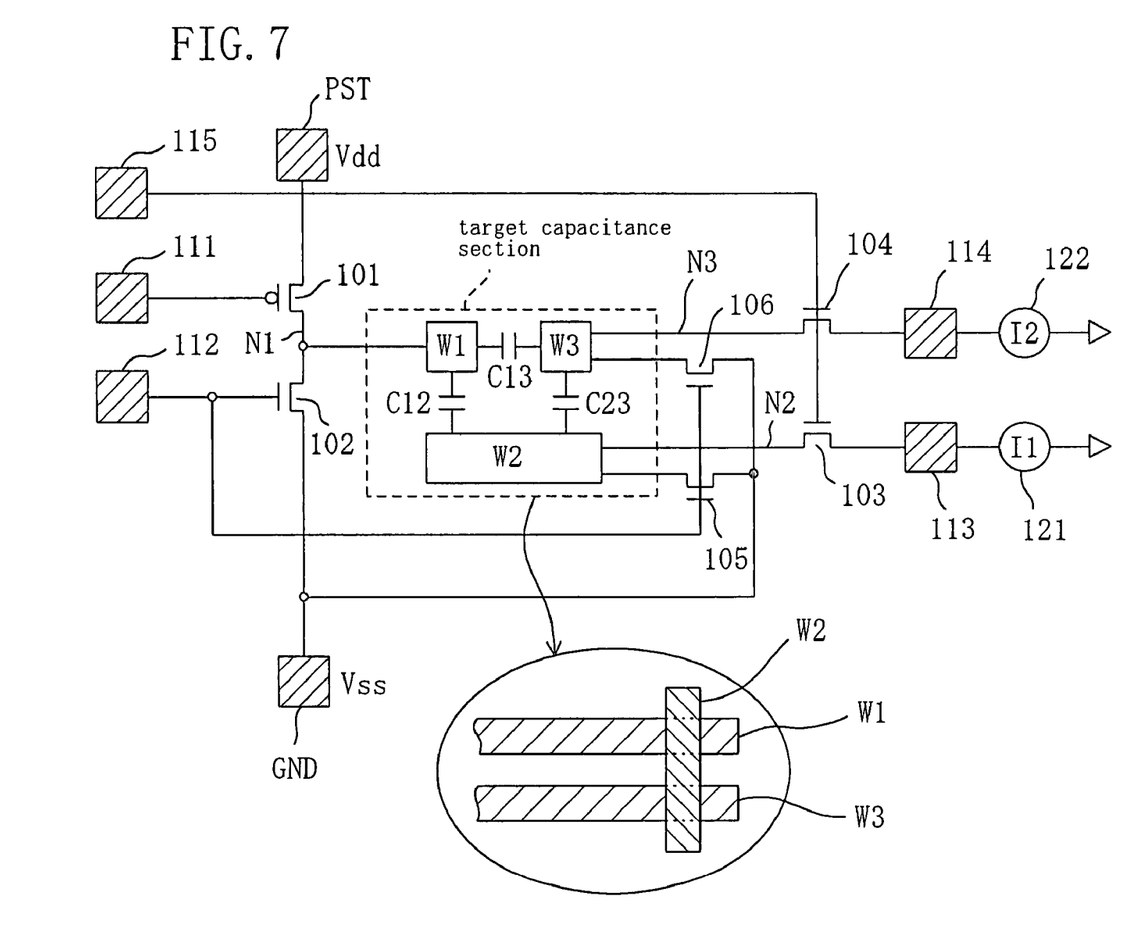
FIG. 7 is a circuit diagram illustrating the structure of a capacitance measuring circuit for measuring parasitic capacitance disclosed in Patent Document 1.

FIG. 7 is a circuit diagram illustrating the structure of a capacitance measuring circuit for measuring parasitic capacitances as disclosed in Patent Document 1.

As shown in this figure, a P-type Metal Insulator Semiconductor Field Effect Transistor (PMISFET) 101 and an N-type Metal Insulator Semiconductor Field Effect Transistor) 102 are connected in series to each other, and the drain of each of the PMISFET 101 and the NMISFET 102 is connected via a node N1 to an interconnect W1. The source of the PMISFET 101 is connected to a power supply pad PST for supplying a power supply voltage Vdd, while the source of the NMISFET 102 is connected to a ground pad GND (voltage Vss). The gate of the PMISFET 101 is connected to a charging pad 111, while the gate of the NMISFET 102 is connected to a discharging pad 112. Furthermore, there are provided an interconnect W2 arranged in a layer higher than the interconnect W1 and crossing the interconnect W1 when viewed in a plane, and an interconnect W3 extending substantially parallel to the interconnect W1 and crossing the interconnect W2 when viewed in the same plane. The interconnect W2 is connected to a first pad 113 for measuring current via a node N2 and an NMISFET 103, while the interconnect W3 is connected to a second pad 114 for measuring current via a node N3 and an NMISFET 104. The gate of each of the NMISFETs 103 and 104 is connected to a current-monitoring pad 115. The capacitance measuring circuit is configured so that it can measure currents I1 and I2 by bringing the first and second pads 113 and 114 for measuring current into contact with probes of ammeters 121 and 122, respectively. When the probes of the ammeters 121 and 122 come into contact with the pads 113 and 114 for measuring current, respectively, the sources of the NMISFETs 103 and 104 are fixed at 0V.

The interconnect W2 is connected via an NMISFET 105 to the ground pad GND, while the interconnect W3 is connected via an NMISFET 106 to the ground pad GND.

Here, the capacitance between the interconnects W1 and W2 is designated C12, the capacitance between the interconnects W1 and W3 is designated C13, and the capacitance between the interconnects W2 and W3 is designated C23. In this relation, the capacitance C12 is a value obtained by dividing a charge induced in the interconnect W2 when a voltage is applied to the interconnect W1, by the applied voltage. The capacitance C13 is a value obtained by dividing a charge induced in the interconnect W3 when a voltage is applied to the interconnect W1, by the applied voltage.

Figure 8:
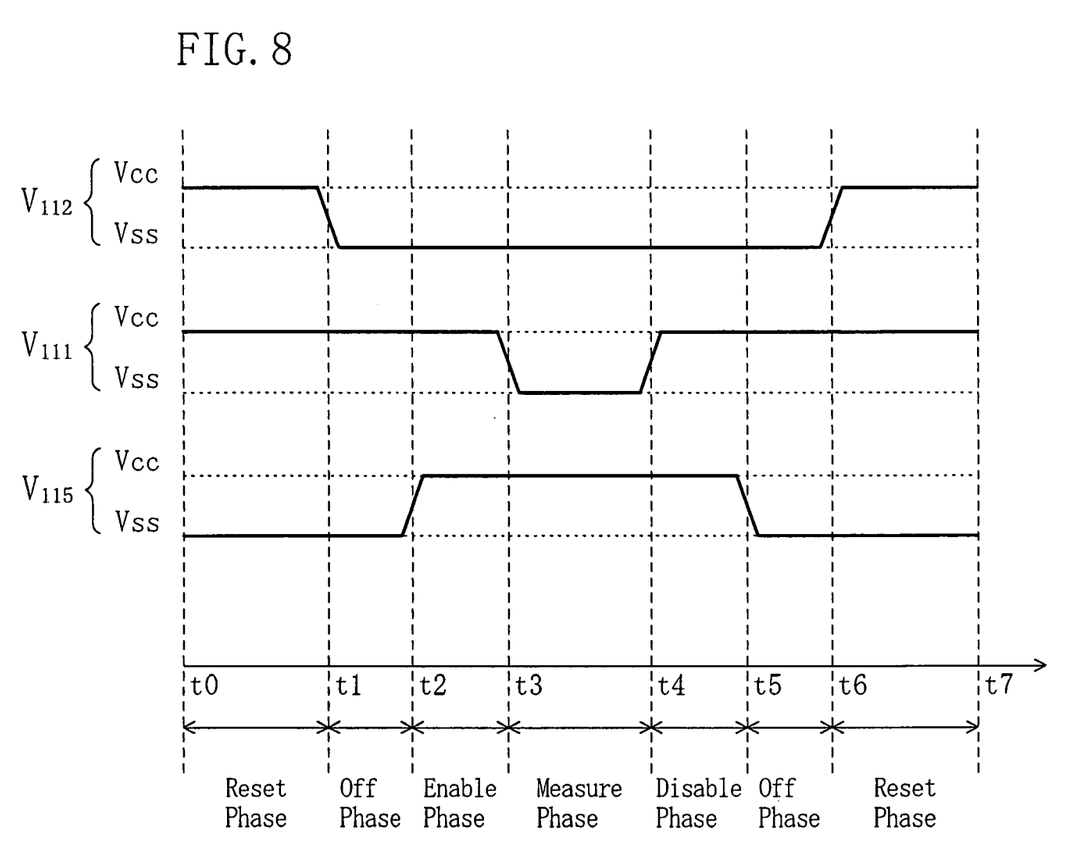
FIG. 8 is a timing diagram illustrating the operation of the known capacitance measuring circuit.

FIG. 8 is a timing diagram illustrating the operation of the capacitance measuring circuit shown in FIG. 7. The known capacitance measuring circuit operation will be described with reference to FIG. 8.

First, the power supply voltage Vdd is fixed at a voltage Vcc, while the ground voltage Vss is fixed at 0V. A charging voltage $V_{111}$ and a discharging voltage $V_{112}$ are switched between the voltages Vcc and Vss such that both of the PMISFET 101 and the NMISFET 102 are not ON at any timing. However, there exists a timing at which both of the PMISFET 101 and the NMISFET 102 are OFF. Therefore, no flow-through current passing through both of the PMISFET 101 and the NMISFET 102 is produced.

Between timings t0 and t1, the discharging voltage $V_{112}$ is held at the voltage Vcc so that the NMISFETs 102, 105 and 106 are ON. Therefore, the potentials of the nodes N1, N2 and N3 are fixed at the ground voltage Vss.

Between timings t1 and t2, all the MISFETs 101, 102, 103, 104, 105, and 106 are OFF.

Between timings t2 and t3, since the PMISFET 101 and the NMISFET 102 are OFF, and the NMISFETs 103 and 104 are ON, it is possible to monitor currents.

Between timings t3 and t4, since the PMISFET 101 is ON, a charge from the interconnect W1 to the interconnects W2 and W3 is induced. At this time, currents are monitored using the ammeters 121 and 122, thereby measuring the capacitances C12, C13 and C23. The time between the timings t3 and t4 is set at a time enough to induce a charge in the interconnect W1 and monitor the currents using the ammeters 121 and 122.

Between timings t4 and t5, the PMISFET 101 is OFF.

Between timings t5 and t6, since all the MISFETs are OFF, it becomes impossible to monitor the currents.

Between timings t6 and t7, the same operations as between the timings t0 and t1 are carried out. Thereafter, the above-mentioned operations for the timings t1 through t7 are periodically repeated.

The value to be observed by a measuring device using this circuit is a mean value between the currents I1 and I2 detected over time by the ammeters 121 and 122, respectively. When the frequency of the gate input waveform is $f(=1/T)$ (T denotes the time from the timing t0 to the timing t7), the following formulae (1) and (2) hold:

$$I1 = C12 \cdot Vcc \cdot f \qquad (1)$$

$$I2 = C13 \cdot Vcc \cdot f \qquad (2)$$

By using the formulae (1) and (2), measured capacitance values C12 and C13 are obtained from the following formulae (3) and (4):

$$C12 = I1/(Vcc \cdot f) \qquad (3)$$

$$C13 = I2/(Vcc \cdot f) \qquad (4)$$

This known technique is characterized in that the desired capacitances C12 and C13 can directly be measured without the need for canceling the parasitic capacitance of a transistor.

SUMMARY OF THE INVENTION

The known technique, however, has the following defects:

(1) the capacitance value C23 between the interconnects W2 and W3 as shown in FIG. 7 cannot be measured using a circuit pattern shown in FIG. 7;

(2) even when the circuit pattern shown in FIG. 7 is used, the charge induced in the interconnect W1 when a voltage is applied to the interconnect W2 and the charge induced in the interconnect W1 when a voltage is applied to the interconnect W3 cannot be measured; and (3) the number of pads is large for the number of measurable items and typically the area of each of the pads is approximately 100 μm×100 μm, leading to an increase in the area occupied by the semiconductor device.

Furthermore, concerning the defect (2), the difference between Cgd(=dQg/dVd, Qg: gate charge, Vd: drain voltage) and Cdg(=dQd/dVg, Qd: drain charge, Vg: gate voltage) in the MIS capacitance cannot be measured.

It is an object of the present invention to provide a semiconductor device including a capacitance measuring circuit that can separately measure capacitance components.

The semiconductor device of the present invention comprises a capacitance measuring circuit in which, when there exist first through third conductor members, the first and second conductor members are connected via respective switching transistors to a common charging voltage supply part and the second and third conductor members are connected via respective switching transistors to a current sampling part.

Thereby, besides parasitic capacitances between the first and second conductor members and parasitic capacitances between the first and third conductor members, parasitic capacitances between the second and third conductor members can also be measured. Only two pads connected to a charging voltage supply part and a current sampling part, respectively become necessary on a semiconductor chip corresponding to the capacitance measuring circuit. Therefore, the number of pads of the whole semiconductor device can be decreased.

Furthermore, if all the conductor members are chargeable and dischargeable, then the parasitic capacitance caused between the second conductor member and the first conductor member when the second conductor member is charged or the parasitic capacitance caused between the third conductor member and the first conductor member when the third conductor member is charged, for example, can also be measured.

Preferably, there is provided a discharge part, and the conductor member whose parasitic capacitance is not to be measured is discharged while the parasitic capacitance between the other two conductor members is measured.

The first through third conductor members may be all interconnects or may be any three-way combination of a source/drain region, a substrate region and a gate electrode of a MISFET. In the latter case, the semiconductor chip has a triple well structure, thereby reducing the influence of noises in the capacitance measurement.

If the charging voltage supply part is operated at a power supply voltage lower than that supplied to a control circuit, then the influence of substrate noises leading to problems in the measurement of the capacitances representing analog quantities can be suppressed.

There may be provided an oscillator for generating a clock signal having a higher frequency than an external clock signal. This allows the control circuit to generate a waveform. The provision of a frequency divider facilitates external monitoring of the frequency.

DETAILED DESCRIPTION OF THE INVENTION (Embodiment 1)

Figure 1:
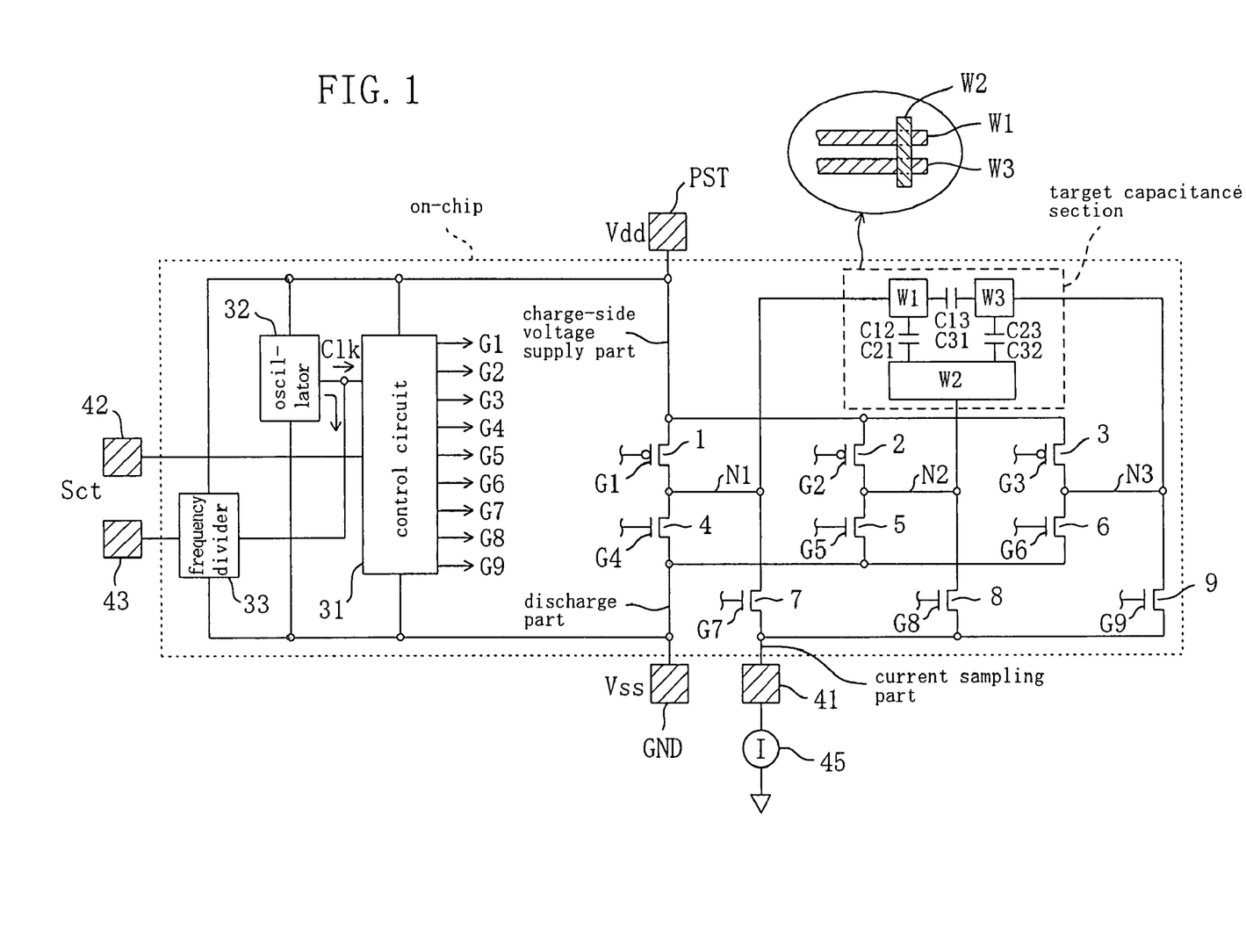
FIG. 1 is a circuit diagram illustrating the structure of a capacitance measuring circuit placed in a semiconductor device according to a first embodiment.

FIG. 1 is a circuit diagram illustrating the structure of a capacitance measuring circuit placed in a semiconductor device (LSI) according to a first embodiment. The capacitance measuring circuit located in the semiconductor device of this embodiment is configured to measure the capacitance (parasitic capacitance) between each two of three conductor members forming a target capacitor section (section to be measured in capacitance).

As shown in FIG. 1, the target capacitor section in the semiconductor device of this embodiment is provided with three conductor members each two opposed with dielectrics interposed therebetween. The three conductor members are an interconnect W1 (first conductor member), an interconnect W2 (second or third conductor member) placed in a layer higher than the interconnect W1 and crossing the interconnect W1 when viewed in a plane, and an interconnect W3 (third or second conductor member) extending substantially parallel to the interconnect W1 and crossing the interconnect W2 when viewed in the same plane. Capacitances between the interconnects W1 and W2 are designated C12 and C21, capacitances between the interconnects W1 and W3 are designated C13 and C31, and capacitances between the interconnects W2 and W3 are designated C23 and C32. In this relation, the capacitance C12 is a value obtained by dividing a charge induced in the interconnect W2 when a voltage is applied to the interconnect W1, by the applied voltage. The capacitance C21 is a value obtained by dividing a charge induced in the interconnect W1 when a voltage is applied to the interconnect W2, by the applied voltage. The capacitance C13 is a value obtained by dividing a charge induced in the interconnect W3 when a voltage is applied to the interconnect W1, by the applied voltage. The capacitance C31 is a value obtained by dividing a charge induced in the interconnect W1 when a voltage is applied to the interconnect W3, by the applied voltage. The capacitance C23 is a value obtained by dividing a charge induced in the interconnect W3 when a voltage is applied to the interconnect W2, by the applied voltage. The capacitance C32 is a value obtained by dividing a charge induced in the interconnect W2 when a voltage is applied to the interconnect W3, by the applied voltage.

In the capacitance measuring circuit, there are placed three PMISFETs 1, 2 and 3 (charge-side switching transistors) placed in parallel with one another and three NMISFETs 4, 5 and 6 (discharge-side switching transistors) connected in series to the PMISFETs 1, 2 and 3, respectively. The sources of the PMISFETs 1, 2 and 3 are commonly connected via a charging voltage supply part to a power supply pad PST for supplying a power supply voltage Vdd, while the sources of the NMISFETs 4, 5 and 6 are commonly connected via a discharging part to a ground pad GND (voltage Vss). The drains of the PMISFET 1 and the NMISFET 4 are connected via a node N1 to the interconnect W1. The drains of the PMISFET 2 and the NMISFET 5 are connected via a node N2 to the interconnect W2. The drains of the PMISFET 3 and the NMISFET 6 are connected via a node N3 to the interconnect W3.

That is, the interconnect W1 is connected via the PMISFET 1 to the charging voltage supply part and the power supply pad PST, the interconnect W2 is connected via the PMISFET 2 to the charging voltage supply part and the power supply pad PST, and the interconnect W3 is connected via the PMISFET 3 to the charging voltage supply part and the power supply pad PST.

Although not shown in FIG. 1, the power supply pad PST is also connected to an active region (substrate region) of each of the PMISFETs 1, 2 and 3, and the ground pad GND is also connected to an active region of each of the NMISFETs 4, 5, 6, 7, 8, and 9, whereby these pads supply potentials to the substrates.

The interconnect W1 is connected via the node N1 and the NMISFET 7 (third switching transistor for measuring current) through a current sampling part to a current-monitoring pad 41. The interconnect W2 is connected via the node N2 and the NMISFET 8 (first or second switching transistor for measuring current) through the current sampling part to the current-monitoring pad 41. The interconnect W3 is connected via the node N3 and the NMISFET 9 (second or first switching transistor for measuring current) through the current sampling part to the current-monitoring pad 41. That is, all of the interconnects W1, W2 and W3 are connected to the current-monitoring pad 41 through the common current-sampling part and are configured so that their currents I can be measured by bringing a probe of an ammeter 45 into contact with the current-monitoring pad 41. The outlet side of the ammeter 45 is fixed at the ground level (0V).

A control circuit 31, an oscillator 32 for generating a clock signal having a higher frequency than an external clock signal and a frequency divider 33 are connected in parallel to one another between the power supply pad PST (voltage Vdd) and the ground pad GND (voltage Vss). The control circuit 31 operates in synchronization with a high-frequency clock signal Clk generated by the oscillator 32 and applies a bias for ON/OFF switching to each of the gates G1 through G9 of the MISFETs 1 through 9. A high-frequency signal output from the oscillator 32 is input to an input part of the frequency divider 33, and an output part of the frequency divider 33 is connected to a frequency-monitoring pad 43.

According to the semiconductor device of this embodiment, in the capacitance measuring circuit, the interconnect W1 that is the first conductor member is connected via the PMISFET 1 that is the charge-side switching transistor to the charging voltage supply part, the interconnect W2 (or W3) that is the second conductor member and the interconnect W3 (or W2) that is the third conductor member are connected to the current-sampling part via the NMISFETs 8 and 9 that are the switching transistors for measuring current, respectively, and the interconnect W2 (or W3) that is the second conductor member is connected to the charging voltage supply part via the PMISFET 2 (or 3) that is the charge-side switching transistor. Therefore, it becomes possible to measure the capacitance C23 between the interconnects W2 and W3 (or the capacitance C32 between the interconnects W3 and W2) in addition to the capacitance C12 between the interconnects W1 and W2 and the capacitance C13 between the interconnects W1 and W3.

Furthermore, the interconnects W2 and W3 are connected to the charging voltage supply part via the PMISFET 2 and 3 that are the charge-side switching transistors, and the interconnect W1 is connected to the current-sampling part via the NMISFET 7 that is the switching transistor for measuring current. Therefore, as will be described later, it becomes possible to separately measure all the capacitive components among the three interconnects W1, W2 and W3, i.e., the capacitances C12 and C21 between the interconnects W1 and W2, the capacitances C13 and C31 between the interconnects W1 and W3 and the capacitances C23 and C32 between the interconnects W2 and W3.

Moreover, the interconnects W1, W2 and W3 are connected via the NMISFETs 4, 5 and 6 that are the discharge switching transistors, respectively, through the discharge part to the ground pad. Therefore, in a mode for measuring the capacitance between two interconnects, it becomes possible to fix the potential of an interconnect that is not involved in the capacitance measurement, thereby preventing the accuracy of measuring the capacitance from being deteriorated due to the influence of the interconnect that is not involved in the capacitance measurement.

The capacitance measuring circuit of this embodiment has the advantages that the inclusion of the oscillator 32 therein allows the control circuit 31 to generate a waveform by applying a clock signal having a higher frequency than an external clock signal to the control circuit 31 and the inclusion of the frequency divider 33 therein simplifies the external monitoring of the frequency.

Figure 2:
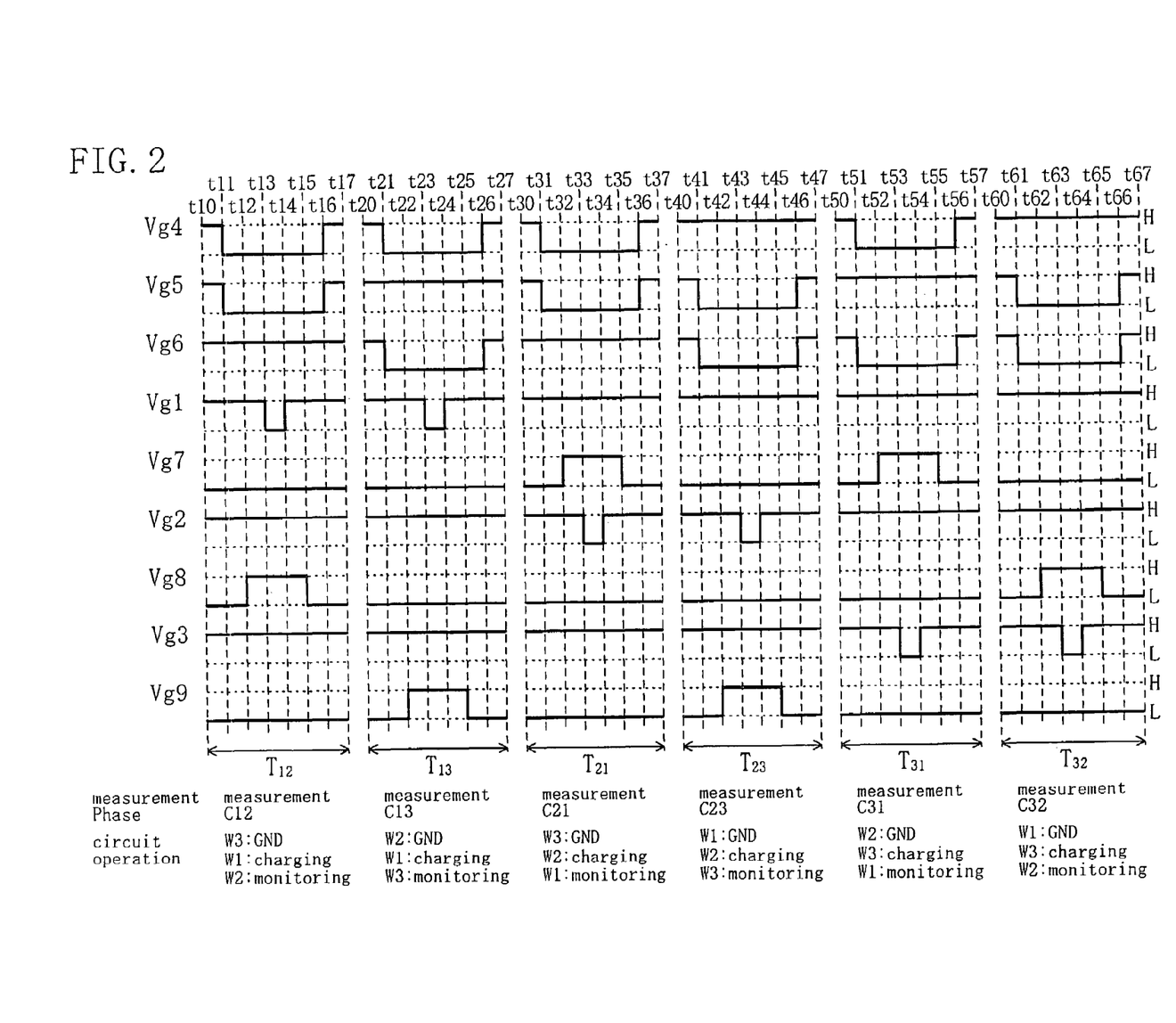
FIG. 2 is a timing diagram illustrating the time variation of gate biases that are output from a control circuit in the capacitance measurement using the capacitance measuring circuit and are applied to gates of MISFETs, respectively.

FIG. 2 is a timing diagram illustrating the time variation of gate biases Vg1 through Vg9 that are output from the control circuit 31 in the capacitance measurement using the capacitance measuring circuit and are applied to the gates G1 through G9 of the MISFETs 1 through 9. In this figure, $T_{12}$ denotes the period during which the capacitance C12 is monitored, $T_{13}$ denotes the period during which the capacitance C13 is monitored, $T_{21}$ denotes the period during which the capacitance C21 is monitored, $T_{23}$ denotes the period during which the capacitance C23 is monitored, $T_{31}$ denotes the period during which the capacitance C31 is monitored, and $T_{32}$ denotes the period during which the capacitance C32 is monitored. Although not shown in FIG. 2, the power supply voltage Vdd is fixed at a voltage Vcc, and the ground voltage Vss is fixed at 0V.

Control During the Period $T_{12}$

First, the NMISFETs 4, 5 and 6 are ON at a timing t10, because the gate biases Vg4, Vg5 and Vg6 of the NMISFETs 4, 5 and 6 are all at H level. The PMISFETs 1, 2 and 3 are OFF, because the gate biases Vg1, Vg2 and Vg3 of the NMISFETs 1, 2 and 3 are all at H level. The NMISFETs 7, 8 and 9 are OFF, because the gate biases Vg7, Vg8 and Vg9 of the NMISFETs 7, 8 and 9 are all at L level. Since at this time the NMISFETs 4, 5 and 6 are ON and the PMISFET 1, 2 and 3 are OFF, charges on the nodes N1, N2 and N3 are all released into the ground.

At a timing t11, the gate biases Vg4 and Vg5 of the NMISFETs 4 and 5 change to L level so that the NMISFETs 4 and 5 turn OFF. Therefore, the nodes N1 and N2 are cut off from the ground pad GND.

Next, at a timing t12, the gate bias Vg8 of the NMISFET 8 changes to H level so that the NMISFET 8 turns ON. Therefore, the interconnect W2 is brought into conduction with the current-monitoring pad 41 via the node N2.

Next, at a timing t13, the gate bias Vg1 of the PMISFET 1 changes to L level so that the PMISFET 1 turns ON. Therefore, the interconnect W1 is brought into conduction with the power supply pad PST via the node N1, and thus the interconnect W1 is charged.

Accordingly, when the probe of the ammeter 45 is brought into contact with the current-monitoring pad 41 during a period from the timing t13 to the timing t14 to measure the current I, the capacitance value C12 between the interconnects W1 and W2 can be measured from the current I corresponding to the charge induced in the interconnect W2 when the voltage Vcc is applied to the interconnect W1, on the basis of the following formula (5):

$$C12=I/(Vcc \cdot f) \quad (5)$$

where f(=1/T) is the frequency of the gate input waveform and T denotes the time from the timing t10 to the timing t17.

Thereafter, gate biases are changed such that the operations opposite to those at the timings t13, t12, t11, and t10 are carried out at the timings t14, t15, t16, and t17, respectively. Finally, the control state at the timing 17 is returned to the same state as at the timing t10.

During the period $T_{12}$, the PMISFET 1 and the NMISFET 4 or the NMISFET 7 are not ON simultaneously. Thus, a flow-through current that flows through the PMISFET 1 and the NMISFET 4 or the NMISFET 7 does not flow from the power supply pad PST into the current-monitoring pad 41 and the ground pad GND. During the period $T_{12}$, the PMISFETs 2 and 3 are always OFF. Thus, the interconnects W2 and W3 are not charged with the voltage Vcc. Moreover, during the period $T_{12}$, the NMISFETs 7 and 9 are always OFF. Thus, the nodes N1 and N3 are not brought into conduction with the current-monitoring pad 41, and consequently currents from the interconnects W1 and W3 are not observed. Since during the period $T_{12}$ the gate bias Vg6 of the NMISFET 6 is always at H level, the NMISFET 6 is always ON, and the potential of the node N3 is fixed at 0V. Therefore, the capacitance relating to the interconnect W3 is not observed.

Control During the Period $T_{13}$

First, at a timing t20, each of the gate biases Vg1 through Vg9 of the MISFETs 1 through 9 is at the same voltage level as at the timing t10 during the period $T_{12}$.

At a timing t21, the gate biases Vg4 and Vg6 of the NMISFETs 4 and 6 change to L level so that the NMISFETs 4 and 6 turn OFF. Therefore, the nodes N1 and N3 are cut off from the ground pad GND.

Next, at a timing t22, the gate bias Vg9 of the NMISFET 9 changes to H level so that the NMISFET 9 turns ON. Therefore, the interconnect W3 is brought into conduction with the current-monitoring pad 41 via the node N3.

Next, at a timing t23, the gate bias Vg1 of the PMISFET 1 changes to L level so that the PMISFET 1 turns ON.

Therefore, the interconnect W1 is brought into conduction with the power supply pad PST via the node N1, and thus the interconnect W1 is charged.

Accordingly, when the probe of the ammeter 45 is brought into contact with the current-monitoring pad 41 during a period from the timing t23 to the timing t24 to measure the current I, the capacitance value C13 between the interconnects W1 and W3 can be measured from the current I corresponding to the charge induced in the interconnect W3 when the voltage Vcc is applied to the interconnect W1, on the basis of the following formula (6):

$$C13=I/(Vcc \cdot f) \quad (6)$$

where f(=1/T) is the frequency of the gate input waveform and T denotes the time from the timing t20 to the timing t27.

Thereafter, gate biases are changed such that the operations opposite to those at the timings t23, t22, t21, and t20 are carried out at the timings t24, t25, t26, and t27, respectively. Finally, the control state at the timing 27 is returned to the same state as at the timing t20.

During the period $T_{13}$, the PMISFET 1 and the NMISFET 4 or the NMISFET 7 are not ON simultaneously. Thus, a flow-through current that flows through the PMISFET 1 and the NMISFET 4 or the NMISFET 7 does not flow from the power supply pad PST into the current-monitoring pad 41 and the ground pad GND. During the period $T_{13}$, the PMISFETs 2 and 3 are always OFF. Thus, the interconnects W2 and W3 are not charged with the voltage Vcc. Moreover, during the period $T_{13}$, the NMISFETs 7 and 8 are always OFF. Thus, the nodes N1 and N2 are not brought into conduction with the current-monitoring pad 41, and consequently currents from the interconnects W1 and W2 are not observed. Since during the period $T_{13}$ the gate bias Vg5 of the NMISFET 5 is always at H level, the NMISFET 5 is always ON, and the potential of the node N2 is fixed at 0V. Therefore, the capacitance relating to the interconnect W2 is not observed.

Control During the Period $T_{21}$

First, at a timing t30, each of the gate biases Vg1 through Vg9 of the MISFETs 1 through 9 is at the same voltage level as at the timing t10 during the period $T_{12}$.

At a timing t31, the gate biases Vg4 and Vg5 of the NMISFETs 4 and 5 change to L level so that the NMISFETs 4 and 5 turn OFF. Therefore, the nodes N1 and N2 are cut off from the ground pad GND.

Next, at a timing t32, the gate bias Vg7 of the NMISFET 7 changes to H level so that the NMISFET 7 turns ON. Therefore, the interconnect W1 is brought into conduction with the current-monitoring pad 41 via the node N1.

Next, at a timing t33, the gate bias Vg2 of the PMISFET 2 changes to L level so that the PMISFET 2 turns ON. Therefore, the interconnect W2 is brought into conduction with the power supply pad PST via the node N2, and thus the interconnect W2 is charged.

Accordingly, when the probe of the ammeter 45 is brought into contact with the current-monitoring pad 41 during a period from the timing t33 to the timing t34 to measure the current I, the capacitance value C21 between the interconnects W2 and W1 can be measured from the current I corresponding to the charge induced in the interconnect W1 when the voltage Vcc is applied to the interconnect W2, on the basis of the following formula (7):

$$C21=I/(Vcc \cdot f) \quad (7)$$

where f(=1/T) is the frequency of the gate input waveform and T denotes a time from the timing t30 to the timing t37.

Thereafter, gate biases are changed such that the operations opposite to those at the timings t33, t32, t31, and t30 are carried out at the timings t34, t35, t36, and t37, respectively. Finally, the control state at the timing t37 is returned to the same state as at the timing t30.

During the period $T_{21}$, the PMISFET 2 and the NMISFET 5 or the NMISFET 8 are not ON simultaneously. Thus, a flow-through current that flows through the PMISFET 2 and the NMISFET 5 or the NMISFET 8 does not flow from the power supply pad PST into the current-monitoring pad 41 and the ground pad GND. During the period $T_{21}$, the PMISFETs 1 and 3 are always OFF. Thus, the interconnects W1 and W3 are not charged with the voltage Vcc. Moreover, during the period $T_{21}$, the NMISFETs 7 and 9 are always OFF. Thus, the nodes N1 and N3 are not brought into conduction with the current-monitoring pad 41, and consequently currents from the interconnects W1 and W3 are not observed. Since during the period $T_{21}$ the gate bias Vg6 of the NMISFET 6 is always at H level, the NMISFET 6 is always ON, and the potential of the node N3 is fixed at 0V. Therefore, the capacitance relating to the interconnect W3 is not observed.

Control During the Period $T_{23}$

First, at a timing t40, each of the gate biases Vg1 through Vg9 of the MISFETs 1 through 9 is at the same voltage level as at the timing t10 during the period $T_{12}$.

At a timing t41, the gate biases Vg5 and Vg6 of the NMISFETs 5 and 6 change to L level so that the NMISFETs 5 and 6 turn OFF. Therefore, the nodes N1 and N3 are cut off from the ground pad GND.

Next, at a timing t42, the gate bias Vg9 of the NMISFET 9 changes to H level so that the NMISFET 9 turns ON. Therefore, the interconnect W3 is brought into conduction with the current-monitoring pad 41 via the node N3.

Next, at a timing t43, the gate bias Vg2 of the PMISFET 2 changes to L level so that the PMISFET 2 turns ON. Therefore, the interconnect W2 is brought into conduction with the power supply pad PST via the node N2, and thus the interconnect W2 is charged.

Accordingly, when the probe of the ammeter 45 is brought into contact with the current-monitoring pad 41 during a period from the timing t43 to the timing t44 to measure the current I, the capacitance value C23 between the interconnects W2 and W3 can be measured from the current I corresponding to the charge induced in the interconnect W3 when the voltage Vcc is applied to the interconnect W2, on the basis of the following formula (8):

$$C23=I/(Vcc \cdot f) \qquad (8)$$

where f(=1/T) is the frequency of the gate input waveform and T denotes the time from the timing t40 to the timing t47.

Thereafter, gate biases are changed such that the operations opposite to those at the timings t43, t42, t41, and t40 are carried out at the timings t44, t45, t46, and t47, respectively. Finally, the control state at the timing t47 is returned to the same state as at the timing t40.

During the period $T_{23}$, the PMISFET 2 and the NMISFET 5 or the NMISFET 8 are not ON simultaneously. Thus, a flow-through current that flows through the PMISFET 2 and the NMISFET 5 or the NMISFET 8 does not flow from the power supply pad PST into the current-monitoring pad 41 and the ground pad GND. During the period $T_{23}$, the PMISFETs 1 and 3 are always OFF. Thus, the interconnects W1 and W3 are not charged with the voltage Vcc. Moreover, during the period $T_{23}$, the NMISFETs 7 and 8 are always OFF. Thus, the nodes N1 and N2 are not brought into conduction with the current-monitoring pad 41, and consequently currents from the interconnects W1 and W2 are not observed. Since during the period $T_{23}$ the gate bias Vg4 of the NMISFET 4 is always at H level, the NMISFET 4 is always ON, and the potential of the node N1 is fixed at 0V. Therefore, the capacitance relating to the interconnect W1 is not observed.

Control During the Period $T_{31}$

First, at a timing t50, each of the gate biases Vg1 through Vg9 of the MISFETs 1 through 9 is at the same voltage level as at the timing t10 during the period $T_{12}$.

At a timing t51, the gate biases Vg4 and Vg6 of the NMISFETs 4 and 6 change to L level so that the NMISFETs 4 and 6 turn OFF. Therefore, the nodes N1 and N3 are cut off from the ground pad GND.

Next, at a timing t52, the gate bias Vg7 of the NMISFET 7 changes to H level so that the NMISFET 7 turns ON. Therefore, the interconnect W1 is brought into conduction with the current-monitoring pad 41 via the node N1.

Next, at a timing t53, the gate bias Vg3 of the PMISFET 3 changes to L level so that the PMISFET 3 turns ON. Therefore, the interconnect W3 is brought into conduction with the power supply pad PST via the node N3, and thus the interconnect W3 is charged.

Accordingly, when the probe of the ammeter 45 is brought into contact with the current-monitoring pad 41 during a period from the timing t53 to the timing t54 to measure the current I, the capacitance value C31 between the interconnects W3 and W1 can be measured from the current I corresponding to the charge induced in the interconnect W1 when the voltage Vcc is applied to the interconnect W3, on the basis of the following formula (9):

$$C31=I/(Vcc \cdot f) \qquad (9)$$

where f(=1/T) is the frequency of the gate input waveform and T denotes the time from the timing t50 to the timing t57.

Thereafter, gate biases are changed such that the operations opposite to those at the timings t53, t52, t51, and t50 are carried out at the timings t54, t55, t56, and t57, respectively. Finally, the control state at the timing t57 is returned to the same state as at the timing t50.

During the period $T_{31}$, the PMISFET 3 and the NMISFET 6 or the NMISFET 9 are not ON simultaneously. Thus, a flow-through current that flows through the PMISFET 3 and the NMISFET 6 or the NMISFET 9 does not flow from the power supply pad PST into the current-monitoring pad 41 and the ground pad GND. During the period $T_{31}$, the PMISFETs 1 and 2 are always OFF. Thus, the interconnects W1 and W2 are not charged with the voltage Vcc. Moreover, during the period $T_{31}$, the NMISFETs 8 and 9 are always OFF. Thus, the nodes N2 and N3 are not brought into conduction with the current-monitoring pad 41, and consequently currents from the interconnects W2 and W3 are not observed. Since during the period $T_{31}$ the gate bias Vg5 of the NMISFET 5 is always at H level, the NMISFET 5 is always ON, and the potential of the node N2 is fixed at 0V. Therefore, the capacitance relating to the interconnect W2 is not observed.

Control During the Period $T_{32}$

First, at a timing t60, each of the gate biases Vg1 through Vg9 of the MISFETs 1 through 9 is at the same voltage level as at the timing t10 during the period $T_{12}$.

At a timing t61, the gate biases Vg5 and Vg6 of the NMISFETs 5 and 6 change to L level so that the NMISFETs 5 and 6 turn OFF. Therefore, the nodes N2 and N3 are cut off from the ground pad GND.

Next, at a timing t62, the gate bias Vg8 of the NMISFET 8 changes to H level so that the NMISFET 8 turns ON. Therefore, the interconnect W2 is brought into conduction with the current-monitoring pad 41 via the node N2.

Next, at a timing t63, the gate bias Vg3 of the PMISFET 3 changes to L level so that the PMISFET 3 turns ON. Therefore, the interconnect W3 is brought into conduction with the power supply pad PST via the node N3, and thus the interconnect W3 is charged.

Accordingly, when the probe of the ammeter 45 is brought into contact with the current-monitoring pad 41 during a period from the timing t63 to the timing t64 to measure the current I, the capacitance value C32 between the interconnects W3 and W2 can be measured from the current I corresponding to the charge induced in the interconnect W1 when the voltage Vcc is applied to the interconnect W3, on the basis of the following formula (10):

$$C32 = I/(Vcc \cdot f) \qquad (10)$$

where f(=1/T) is the frequency of the gate input waveform and T denotes the time from the timing t60 to the timing t67.

Thereafter, gate biases are changed such that the operations opposite to those at the timings t63, t62, t61, and t60 are carried out at the timings t64, t65, t66, and t67, respectively. Finally, the control state at the timing t67 is returned to the same state as at the timing t60.

During the period $T_{32}$, the PMISFET 3 and the NMISFET 6 or the NMISFET 9 are not ON simultaneously. Thus, a flow-through current that flows through the PMISFET 3 and the NMISFET 6 or the NMISFET 9 does not flow from the power supply pad PST into the current-monitoring pad 41 and the ground pad GND. During the period T32, the PMISFETs 1 and 2 are always OFF. Thus, the interconnects W1 and W2 are not charged with the voltage Vcc. Moreover, during the period $T_{32}$, the NMISFETs 7 and 9 are always OFF. Thus, the nodes N1 and N3 are not brought into conduction with the current-monitoring pad 41, and consequently currents from the interconnects W1 and W3 are not observed. Since during the period $T_{32}$ the gate bias Vg4 of the NMISFET 4 is always at H level, the NMISFET 4 is always ON, and the potential of the node N1 is fixed at 0V. Therefore, the capacitance relating to the interconnect W1 is not observed.

According to the capacitance measuring circuit of this embodiment, when there exist three interconnects W1, W2 and W3, the capacitances C21, C23, C31, and C32 can be measured by charging the interconnects W2 and W3, besides the capacitances C12 and C13 that can be observed by charging the interconnect W1.

In addition, only five pads are necessary for this embodiment. Therefore, the number of pads can be significantly decreased as compared with the number of pads, seven, that is required for the known capacitance measuring circuit shown in FIG. 7, resulting in the reduced area of the semiconductor device.

(Embodiment 2)

Figure 3:
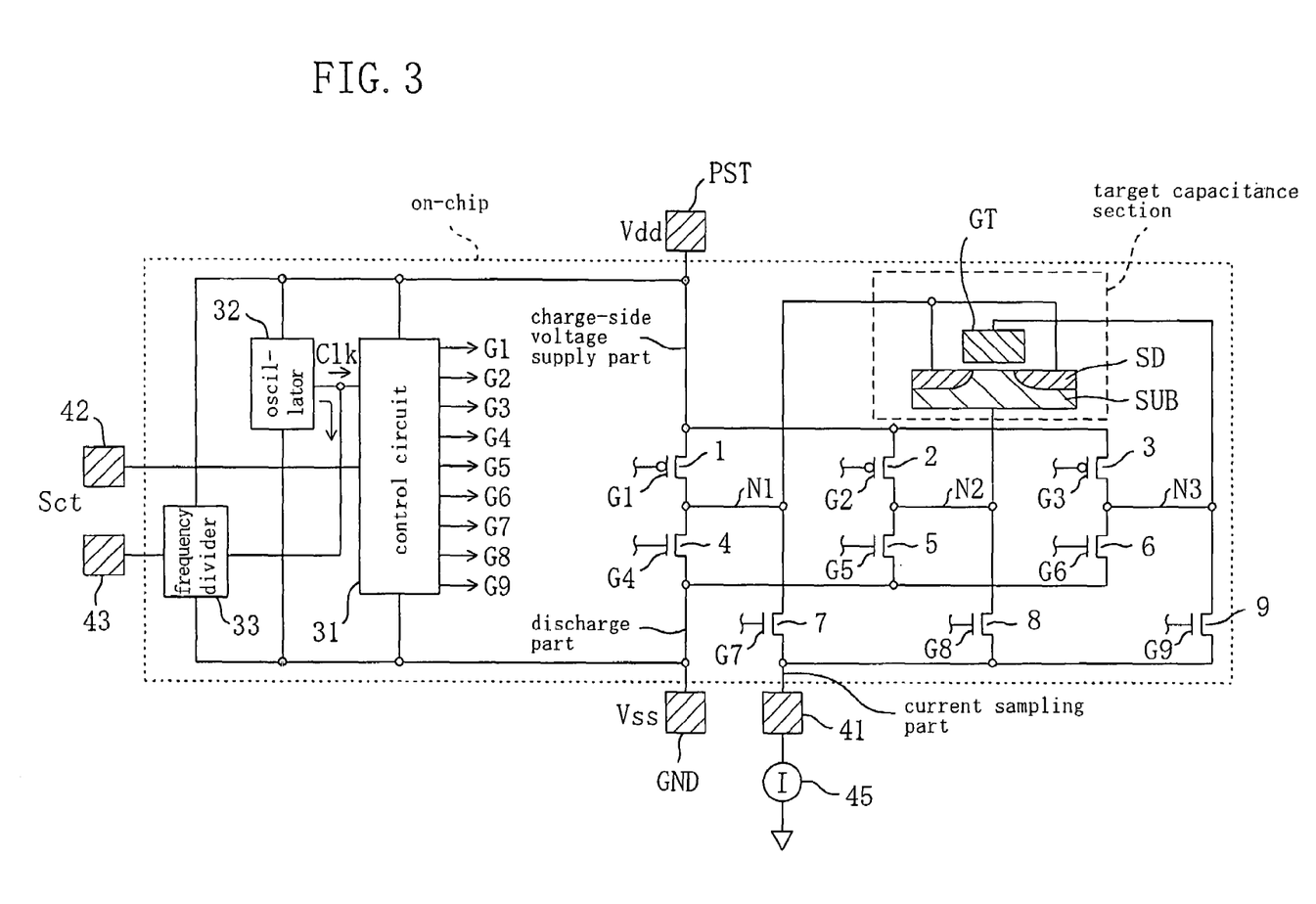
FIG. 3 is a circuit diagram illustrating the structure of a capacitance measuring circuit placed in a semiconductor device according to a second embodiment.

FIG. 3 is a circuit diagram illustrating the structure of a capacitance measuring circuit placed in a semiconductor device (LSI) according to a second embodiment. The capacitance measuring circuit located in the semiconductor device of this embodiment is configured to measure the capacitance (parasitic capacitance) between each two of three conductor members forming a target capacitor section.

As shown in FIG. 3, the target capacitor section in the semiconductor device of this embodiment is also provided with three conductor members each two opposed with dielectrics interposed therebetween. However, unlike the first embodiment, the three conductor members of this embodiment are a source/drain region SD (first conductor member) formed by doping part of a semiconductor substrate with impurities, a substrate region SUB (second conductor member) corresponding to a well and a gate electrode GT (third conductor member).

On the other hand, the structure of the capacitance measuring circuit is the same as that of the first embodiment. Capacitances between the source/drain region SD and the substrate region SUB are designated Cdb (corresponding to C12) and Cbd (corresponding to C21), capacitances between the source/drain region SD and the gate electrode GT are designated Cdg (corresponding to C13) and Cgd (corresponding to C31), and capacitances between the substrate region SUB and the gate electrode GT are designated Cbg (corresponding to C23) and Cgb (corresponding to C32). In this relation, the capacitance Cdb is a value obtained by dividing a charge induced in the substrate region SUB when a voltage is applied to the source/drain region SD, by the applied voltage. The capacitance Cbd is a value obtained by dividing a charge induced in the source/drain region SD when a voltage is applied to the substrate region SUB, by the applied voltage. The capacitance Cdg is a value obtained by dividing a charge induced in the gate electrode GT when a voltage is applied to the source/drain region SD, by the applied voltage. The capacitance Cgd is a value obtained by dividing a charge induced in the source/drain region SD when a voltage is applied to the gate electrode GT, by the applied voltage. The capacitance Cbg is a value obtained by dividing a charge induced in the gate electrode GT when a voltage is applied to the substrate region SUB, by the applied voltage. The capacitance Cgb is a value obtained by dividing a charge induced in the substrate region SUB when a voltage is applied to the gate electrode GT, by the applied voltage.

Figure 4:
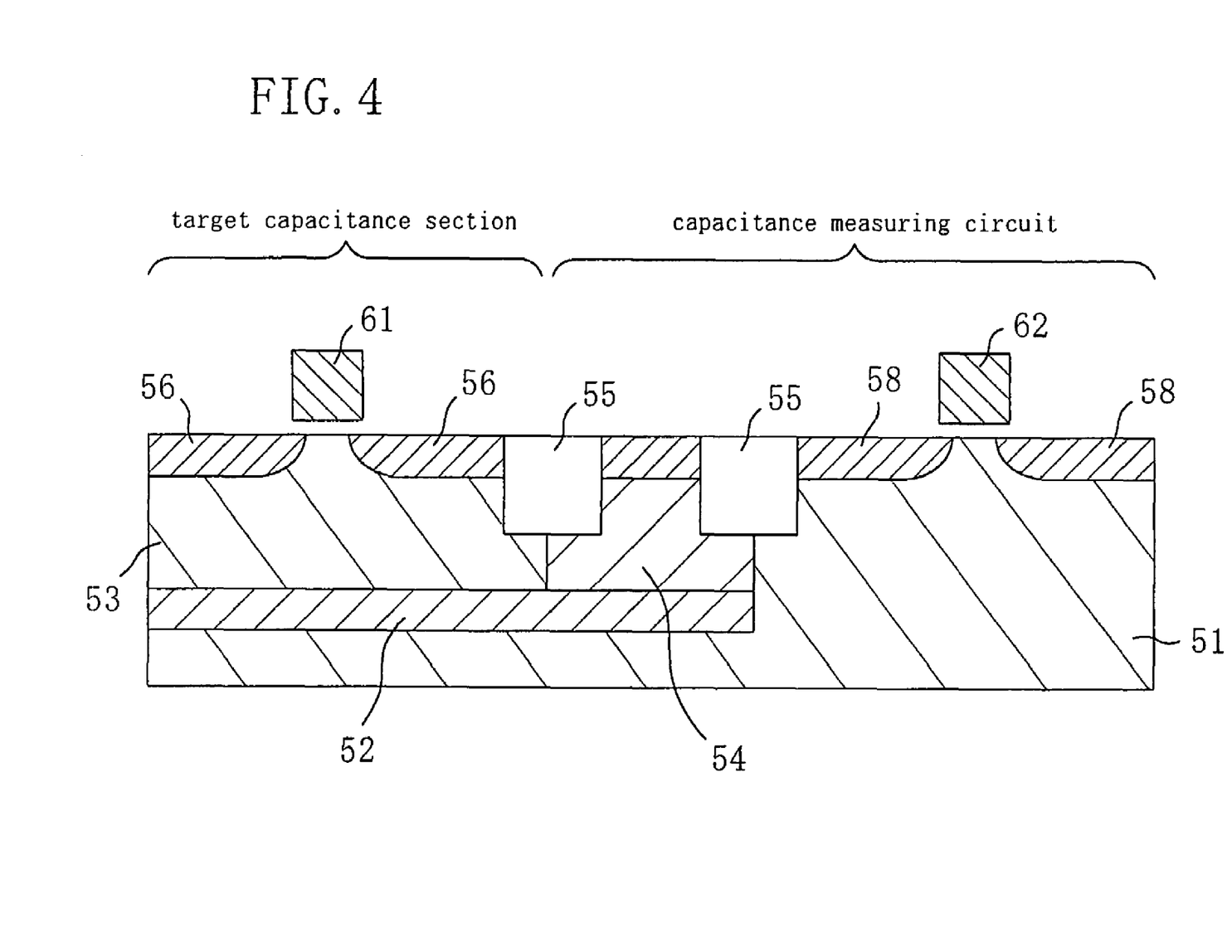
FIG. 4 is a cross sectional view of the semiconductor device according to the second embodiment.

FIG. 4 is a cross sectional view of the semiconductor device of this embodiment. As shown in this figure, the semiconductor device of this embodiment has a structure in which the target capacitor section is surrounded by a triple well.

This figure shows the cross sectional structure of the target capacitor section and the capacitance measuring circuit that are part of a logic circuit located in the semiconductor device but does not show the other regions such as a memory region and a peripheral circuit region.

The semiconductor substrate is partitioned into plural active regions by isolation regions 55 having a shallow trench structure. In the semiconductor substrate, there are provided a P-well 51 occupying most of the semiconductor substrate, a deep N-well 52 the lower side of which is surrounded by the P-well 51, a P-well 53 the lower side of which is covered by the deep N-well 52, and an N-well 54 for separating the P-wells 53 and 51 from each other.

The NMISFET of the target capacitor section comprises a source/drain region 56 (SD) formed by doping the P-well 53 corresponding to the substrate region SUB with N-type impurities, and a gate electrode 61 (GT). On the other hand, the NMISFET of the capacitance measuring circuit comprises a source/drain region 58 formed by doping the P-well 51 with N-type impurities, and a gate electrode 62.

Also in this embodiment, when the capacitances C12 and C21 in the first embodiment are replaced with the capacitances Cdb and Cbd, the capacitances C13 and C31 are replaced with the capacitances Cdg and Cgd, and the capacitances C23 and C32 are replaced with the capacitances Cbg and Cgb, each of the capacitances Cdb, Cbd, Cdg, Cgd, Cbg, and Cgb can be measured utilizing the control method shown in FIG. 2 and the formulae (5) through (10).

Since this embodiment employs, particularly, the structure of the semiconductor device in which the target capacitor section is surrounded by the triple well, capacitances between each two of members of the MISFET can be measured with high accuracy, while noises from the MISFET in the capacitance measuring circuit operating by a high-frequency clock are cut off.

Furthermore, when the voltages of the power supply pad PST, the ground pad GND and the pad 41 for measuring current are changed, the capacitances can be measured in an arbitrary voltage state. In particular, the MIS capacitance has a voltage dependency. The voltage dependencies of the capacitances can be measured by the following formula (11).

$$C(v) = \{I(V+\delta V) - I(V)\}/f \quad (11)$$

(Embodiment 3)

Figure 5:
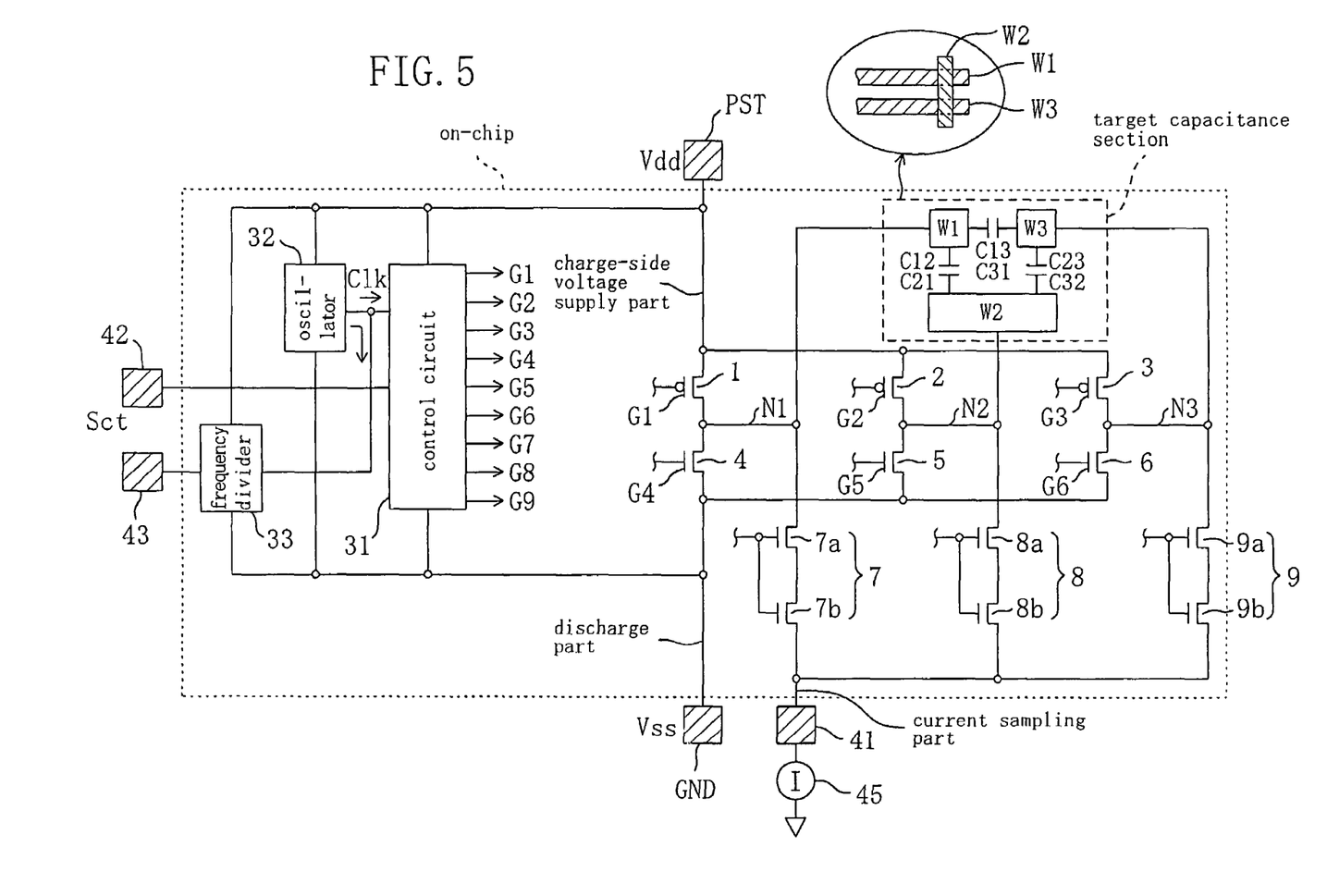
FIG. 5 is a circuit diagram illustrating the structure of a capacitance measuring circuit placed in a semiconductor device according to a third embodiment.

FIG. 5 is a circuit diagram illustrating the structure of a capacitance measuring circuit placed in a semiconductor device (LSI) according to a third embodiment. The capacitance measuring circuit located in the semiconductor device of this embodiment is configured to measure the capacitance (parasitic capacitance) between each two of three conductor members forming a target capacitor section.

Also in this embodiment, as shown in FIG. 5, an interconnect W1 (first conductor member), an interconnect W2 (second conductor member) and an interconnect W3 (third conductor member) are placed as three conductor members in the target capacitor section. The target capacitor section is configured to measure the capacitances C12 and C21 between the interconnects W1 and W2, the capacitances C13 and C31 between the interconnects W1 and W3, and the capacitances C23 and C32 between the interconnects W2 and W3.

The structure of the capacitance measuring circuit of this embodiment is characterized in that two MISFETs 7a and 7b that are equivalent to the NMISFET 7 in the first embodiment are connected in series, two MISFETs 8a and 8b that are equivalent to the NMISFET 8 are connected in series, and two MISFETs 9a and 9b that are equivalent to the NMISFET 9 are connected in series. The pairs of MISFETs receive common gate biases Vg7, Vg8 and Vg9, respectively. While one of each pair of MISFETs (for example, NMISFET 7a, 8a or 9a) is a current-monitoring MISFET having the same threshold voltage as the NMISFETs 7, 8 or 9 in the first embodiment, the other (for example, NMISFETs 7b, 8b or 9b) is a MISFET for suppressing off-leakage current, which has a higher threshold voltage than the NMISFETs 7, 8 and 9 in the first embodiment. The other structure is identical with the structure of the measuring circuit shown in FIG. 1.

Also in the capacitance measuring circuit of this embodiment, the capacitances C12 and C21 between the interconnects W1 and W2, the capacitances C13 and C31 between the interconnects W1 and W3, and the capacitances C23 and C32 between the interconnects W2 and W3 can be measured utilizing the control method shown in FIG. 2 and the formulae (5) through (10).

According to the capacitance measuring circuit of this embodiment, as in the first embodiment, the capacitances C12, C21, C13, C31, C23, and C32 between each two of the three conductor members can be measured while the number of pads is decreased.

In addition, since in the capacitance measuring circuit of this embodiment, a current-monitoring MISFET (for example, NMISFETs 7a, 8a or 9a) and a MISFET for suppressing off-leakage current (for example, NMISFET 7b, 8b or 9b) having a higher threshold voltage than the current-monitoring MISFET are placed in series between each of the nodes N1, N2 and N3 and the pad 41 for measuring current, this effectively decreases leakage current.

Furthermore, since the operations of the current-monitoring MISFET and the MISFET for suppressing off-leakage current are controlled by a common control signal (a gate bias Vg7, Vg8 or Vg9), a redundant control circuit is unnecessary. Therefore, the structure of the control circuit can be simplified.

When the capacity to drive the current-monitoring MISFET is less necessary, the number of MISFETs placed in series with that current-monitoring MISFET can be increased, thereby enhancing the effect of decreasing leakage current.

The conductor members in the third embodiment are not limited to the interconnects W1, W2 and W3 but may be a source/drain region, a substrate region and a gate electrode as shown in FIGS. 3 and 4.

(Embodiment 4)

Figure 6:
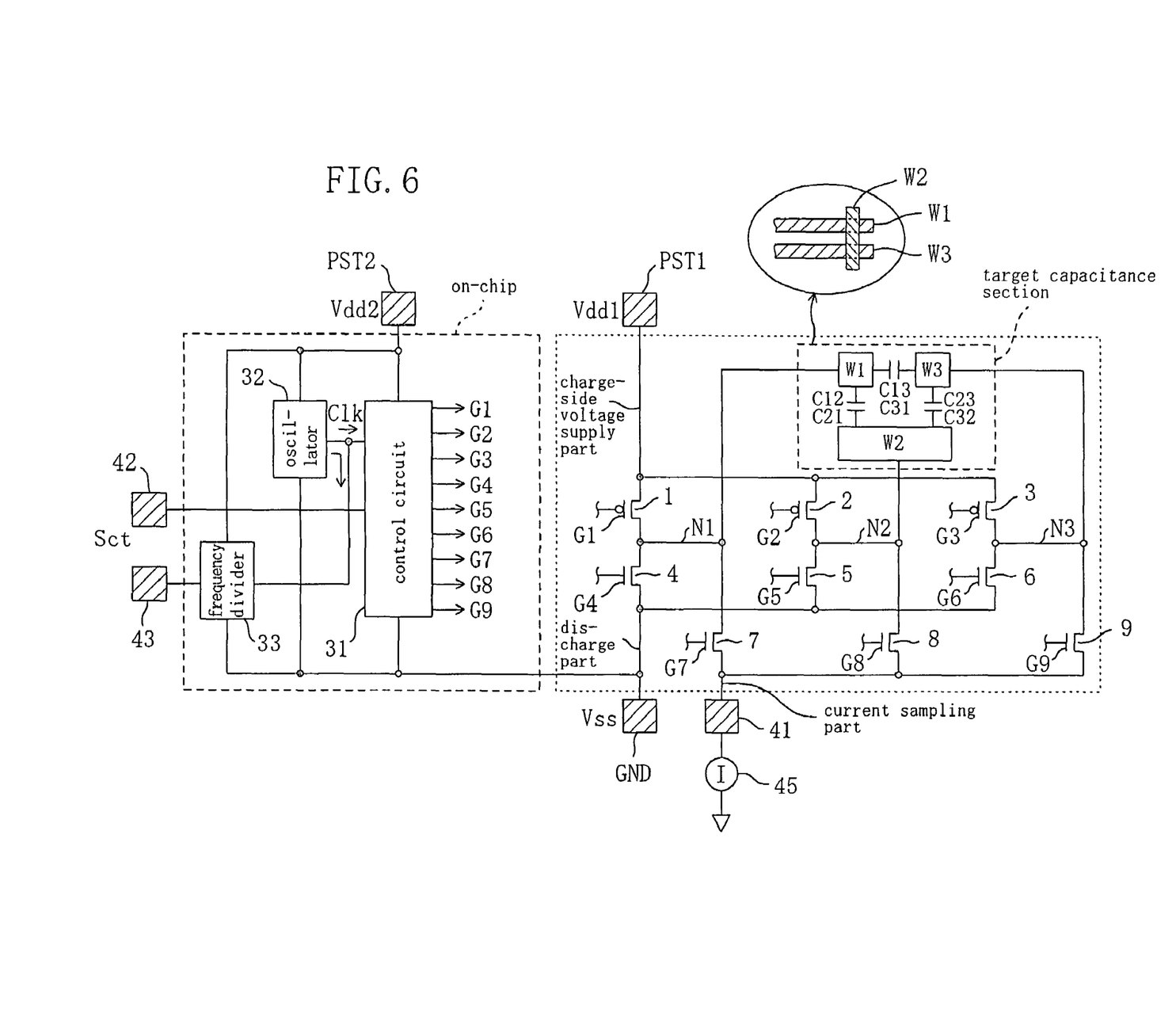
FIG. 6 is a circuit diagram illustrating the structure of a capacitance measuring circuit placed in a semiconductor device according to a fourth embodiment.

FIG. 6 is a circuit diagram illustrating the structure of a capacitance measuring circuit for measuring the capacitances of capacitors placed in a semiconductor device (LSI) according to a fourth embodiment. The capacitance measuring circuit located in the semiconductor device of this embodiment is configured to measure the capacitance between each two of three conductor members forming a target capacitor section.

Also in this embodiment, as shown in FIG. 6, an interconnect W1 (first conductor member), an interconnect W2 (second conductor member) and an interconnect W3 (third conductor member) are placed as three conductor members in the target capacitor section. The target capacitor section is configured to measure the capacitances C12 and C21 between the interconnects W1 and W2, the capacitances C13 and C31 between the interconnects W1 and W3, and the capacitances C23 and C32 between the interconnects W2 and W3.

The structure of the capacitance measuring circuit of this embodiment is characterized in that there are provided power supply pads PST1 and PST2 for individually supplying power supply voltages Vdd1 (for example, 0.1V) and Vdd2 (for example, 1.2V) to the capacitance measuring circuit and the interconnects W1, W2 and W3 of the target capacitor section. The configurations of the other parts are identical with those of the first embodiment.

Also in the capacitance measuring circuit of this embodiment, the capacitances C12 and C21 between the interconnects W1 and W2, the capacitances C13 and C31 between the interconnects W1 and W3, and the capacitances C23 and C32 between the interconnects W2 and W3 can be measured utilizing the control method shown in FIG. 2 and the formulae (5) through (10).

According to the capacitance measuring circuit of this embodiment, as in the first embodiment, the capacitances C12, C21, C13, C31, C23, and C32 between each two of the three conductor members can be measured while the number of pads is decreased.

In addition, since in the semiconductor device of this embodiment there are provided power supply pads PST1 and PST2 for individually supplying power supply voltages Vdd1 and Vdd2 to the capacitance measuring circuit and the interconnects W1, W2 and W3 of the target capacitor section, the following effects can be delivered.

The power supply voltage Vdd1 supplied to the interconnects W1, W2 and W3 is not for controlling the operations of the MISFETs. Thus, the voltage Vdd1 is not required to be much high. The reason is that the gate biases Vg1 through Vg9 of the MISFETs 1 through 9 are supplied from the control circuit 31. If the voltage between the source and drain in each of the MISFETs 1 through 9 is lowered, the operating speed of that MISFET 1 through 9 may be decreased to some extent. In such a case, since the operating frequency is lowered, the function of measuring the capacitances is not degraded. When the voltages applied to the interconnects W1, W2 and W3 are increased, noises are easily included in the currents I to be measured. Contrarily, when, as in this embodiment, the power supply voltage Vdd1 is decreased, the occurrence of the noise can be suppressed.

On the other hand, the power supply voltage Vdd2 supplied to a capacitance sampling part such as the control circuit 31 is for controlling the operations of the MISFETs. Thus, in order to keep the operating speeds of the MISFETs high, the voltage Vdd2 must be high to some extent. Even when the power supply voltage Vdd2 is made higher, the occurrence of noise has less effect on the operation of each MISFET. In general, noises of the substrate lead to inconveniences for an analog circuit but present no problem for a logic circuit.

The conductor members of the fourth embodiment are not limited to the interconnects W1, W2 and W3 but may be a source/drain region, a substrate region and a gate electrode as shown in FIGS. 3 and 4. In the capacitance measuring circuit of the fourth embodiment, each of the NMISFETs 7, 8 and 9 may comprise plural MISFETs placed in series as shown in FIG. 5.

The number of conductor members placed in the target capacitor section, for example, interconnects, may be four or more. Also in this case, if, as shown in FIGS. 1, 3, 5, and 6, one PMISFET and two NMISFETs are placed for each of the conductor members, then the capacitance between each two of the interconnects can be measured.

In each of the embodiments, the semiconductor substrate includes a substrate wholly made of a semiconductor (for example, a semiconductor such as Si, Ge or GaAs), an SOI substrate, and a substrate having a heterojunction (for example, a Si/SiGe-type semiconductor substrate).

According to the semiconductor device of the present invention, the capacitances (parasitic capacitances) among three or more conductor members can be measured separately while the number of necessary pads is decreased.

What is claimed is:

1. A semiconductor device that has a structure in which a semiconductor chip includes a first conductor member, a second conductor member provided with a dielectric interposed between the first conductor member and the second conductor member, a third conductor member provided with a dielectric interposed between each of the first and second conductor members and the third conductor member, and a capacitance measuring circuit,
    wherein the capacitance measuring circuit comprises:
        a charging voltage supply part for charging the first conductor member, said charging voltage supply part being connected via a first charge-side switching transistor to the first conductor member;
        a current sampling part for sampling currents flowing through the second and third conductor members, said current sampling part being connected via first and second switching transistors for measuring current to the second and third conductor members, respectively; and
        a control circuit for controlling ON/OFF switching of each of the switching transistors,
    the second conductor member is connected to the charging voltage supply part via a second charge-side switching transistor whose ON/OFF switching is controllable by the control circuit;
    the third conductor member is connected via a third charge-side switching transistor to the charging voltage supply part;
    the first conductor member is connected via a third switching transistor for measuring current to the current sampling part; and
    a switching transistor for decreasing off-leakage current is placed between each of the first through third conductor members and the current sampling part, said switching transistor being connected in series with a corresponding one of the first through third switching transistors for measuring current and having a higher threshold voltage than said corresponding switching transistor for measuring current.

2. The semiconductor device of claim 1,
    wherein each of the switching transistors for decreasing off-leakage current is controlled by a gate bias common with the switching transistor for measuring current connected in series with the switching transistors for decreasing off-leakage current.

3. The semiconductor device of claim 1,
    wherein the semiconductor device further comprises a discharge part, and
    the first through third conductor members are connected to the discharge part via first through third discharge-side switching transistors, respectively.

4. The semiconductor device of claim 3, wherein:
    the first charge-side switching transistor and the first discharge-side switching transistor are a PMISFET and an NMISFET the drains of which are connected to each other, said common drains being connected to the first conductor member;
    the second charge-side switching transistor and the second discharge-side switching transistor are a PMISFET and an NMISFET the drains of which are connected to each other, said common drains being connected to the second conductor member; and
    the third charge-side switching transistor and the third discharge-side switching transistor are a PMISFET and an NMISFET the drains of which are connected to each other, said common drains being connected to the third conductor member.

5. The semiconductor device of claim 4,
    wherein in a mode for measuring the capacitance between any two of the first through third conductor members, the control circuit holds the discharge-side switching transistor connected to the other conductor member whose current is not to be measured in the ON state.

6. The semiconductor device of claim 1,
    wherein the first through third conductor members are all interconnects.

7. The semiconductor device of claim 1,
    wherein the first through third conductor members are any three-way combination of a source/drain region, a substrate region and a gate electrode of a MISFET.

8. The semiconductor device of claim 7,
    wherein the MISFET is an NMISFET, and
    the substrate region is a P-well located in the uppermost position of a triple well.

9. The semiconductor device of claim 1, wherein the semiconductor device comprises a fourth conductor member in addition to the three conductor members, and in the capacitance measuring circuit, the fourth conductor member is connected via a fourth charge-side switching transistor to the charging voltage supply part and via a fourth switching transistor for measuring current to the current sampling part.

10. The semiconductor device of claim 1, wherein the charging voltage supply part operates at a power supply voltage lower than that supplied to the control circuit.

11. The semiconductor device of claim 1, wherein:

the capacitance measuring circuit comprises an oscillator for generating a clock signal having a higher frequency than an external clock signal; and the control circuit operates on the basis of the clock signal output from the oscillator.

12. The semiconductor device of claim 11, wherein the capacitance measuring circuit comprises a frequency divider for dividing the frequency of the clock signal output from the oscillator.

\* \* \* \* \*

UNITED STATES PATENT AND TRADEMARK OFFICE
CERTIFICATE OF CORRECTION

PATENT NO.         : 6,982,555 B2
APPLICATION NO. : 10/777068
DATED               : January 3, 2006
INVENTOR(S)        : Kyoji Yamashita et al.

It is certified that error appears in the above-identified patent and that said Letters Patent is hereby corrected as shown below:

Title Page,
   Item "(73) Assignee",
      After "Osaka (JP)", add
      -- Renesas Technology Corp., Tokyo (JP) --

Signed and Sealed this

Seventeenth Day of April, 2007

JON W. DUDAS
*Director of the United States Patent and Trademark Office*